(12) United States Patent
Ota (10) Patent No.: US 8,084,938 B2
(45) Date of Patent: Dec. 27, 2011

(54) ORGANIC ELECTROLUMINESCENT PANEL, ORGANIC ELECTROLUMINESCENT DISPLAY, ORGANIC ELECTROLUMINESCENT LIGHTING DEVICE, AND PRODUCTION METHODS THEREOF

(75) Inventor: Yoshifumi Ota, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 104 days.

(21) Appl. No.: 12/519,524

(22) PCT Filed: Dec. 20, 2007

(86) PCT No.: PCT/JP2007/074534
§ 371 (c)(1),
(2), (4) Date: Jun. 17, 2009

(87) PCT Pub. No.: WO2008/078648
PCT Pub. Date: Jul. 3, 2008

(65) Prior Publication Data
US 2010/0090596 A1 Apr. 15, 2010

(30) Foreign Application Priority Data

Dec. 26, 2006 (JP) ................. 2006-350163
Sep. 27, 2007 (JP) ................. 2007-252179

(51) Int. Cl.
*H01L 51/50* (2006.01)
(52) U.S. Cl. ........... 313/504; 313/512; 445/25; 428/690
(58) Field of Classification Search .......... 313/504, 313/512; 445/24, 25; 428/690
See application file for complete search history.

(56) References Cited

U.S. PATENT DOCUMENTS 6,867,539 B1 * 3/2005 McCormick et al. ......... 313/504
(Continued)

FOREIGN PATENT DOCUMENTS

CN 1383352 A 12/2002
(Continued)

OTHER PUBLICATIONS

English Translation of JP2002-324662, published Nov. 8, 2002.*

(Continued)

*Primary Examiner* — Nimeshkumar Patel
*Assistant Examiner* — Mary Ellen Bowman
(74) *Attorney, Agent, or Firm* — Keating & Bennett, LLP (57) ABSTRACT

An organic electroluminescent panel, an organic electroluminescent display, an organic electroluminescent lighting device, each include an organic electroluminescent element that maintains stable light emission characteristics for a long period of time. The organic electroluminescent panel includes an element substrate; a sealing substrate facing the element substrate; and an organic electroluminescent element disposed on a sealing substrate side of the element substrate, wherein the organic electroluminescent panel further includes a first sealing member and a second sealing member, the first sealing member sealing a gap between the element substrate and the sealing substrate, the second sealing member covering the organic electroluminescent element, the first sealing member and the second sealing member being arranged with a space therebetween, the space is in a vacuum or reduced pressure state.

23 Claims, 4 Drawing Sheets

U.S. PATENT DOCUMENTS

| | | | |
|---|---|---|---|
| 6,896,572 B2 * | 5/2005 | Park et al. ............... 445/25 |
| 7,514,115 B2 * | 4/2009 | Takashima et al. ............ 427/66 |
| 7,683,534 B2 * | 3/2010 | Weaver ............... 313/504 |
| 7,705,535 B2 * | 4/2010 | Yamada ............... 313/512 |
| 7,710,030 B2 * | 5/2010 | Lee ............... 313/511 |
| 7,750,558 B2 * | 7/2010 | Cok ............... 313/504 |
| 7,808,173 B2 * | 10/2010 | Kim et al. ............... 313/504 |
| 2002/0158568 A1 | 10/2002 | Satake |
| 2002/0196386 A1 * | 12/2002 | Grace et al. ............... 349/61 |
| 2002/0196401 A1 * | 12/2002 | Grace et al. ............... 349/158 |
| 2003/0071570 A1 | 4/2003 | Tamashiro et al. |
| 2004/0232833 A1 * | 11/2004 | Menda et al. ............... 313/512 |
| 2005/0030258 A1 | 2/2005 | Satake |
| 2005/0079277 A1 * | 4/2005 | Takashima et al. ............ 427/58 |
| 2005/0142379 A1 * | 6/2005 | Juni et al. ............... 428/690 |
| 2007/0013292 A1 | 1/2007 | Inoue et al. |
| 2008/0050585 A1 | 2/2008 | Masuda et al. |
| 2008/0258605 A1 * | 10/2008 | Yukinobu ............... 313/504 |
| 2009/0026946 A1 | 1/2009 | Satake |

FOREIGN PATENT DOCUMENTS

| | | |
|---|---|---|
| JP | 2000-150147 A | 5/2000 |
| JP | 2000-195675 A | 7/2000 |
| JP | 2002-324662 A | 11/2002 |
| JP | 2003-178866 A | 6/2003 |
| JP | 2004-192822 A | 7/2004 |
| JP | 2004-265615 A | 9/2004 |
| JP | 2006-179352 A | 7/2006 |
| WO | 2005/122644 A1 | 12/2005 |

OTHER PUBLICATIONS

Official Communication issued in International Patent Application No. PCT/JP2007/074534, mailed on Mar. 11, 2008.

* cited by examiner

ORGANIC ELECTROLUMINESCENT PANEL, ORGANIC ELECTROLUMINESCENT DISPLAY, ORGANIC ELECTROLUMINESCENT LIGHTING DEVICE, AND PRODUCTION METHODS THEREOF

BACKGROUND OF THE INVENTION

1. Field of the Invention

The present invention relates to an organic electroluminescent (EL) panel, an organic EL display, an organic EL lighting device, and production methods thereof. More particularly, the present invention relates to an organic EL panel that can be preferably used in an organic EL display or an organic EL lighting device, and to an organic EL display, an organic EL lighting device, and production methods thereof.

2. Description of the Related Art

According to a conventional organic EL panel, deterioration of an organic EL element, caused by the organic EL element being exposed to oxygen, moisture, and the like, is prevented by the following sealing can structure commonly used: a desiccant is attached to a sealing can (concave glass can) and a sealing resin is arranged into a frame shape to surround an organic EL element. However, it is difficult to provide the organic EL panel having this sealing can structure with a top-emission structure because in the top-emission structure, light is outputted from an upper surface of the panel (i.e., an increase in aperture ratio is difficult), and further, a reduction in thickness of the panel is also difficult. Hence, research and development on a sealing structure where a flat substrate is used (hereinafter, also referred to as a "flat sealing structure") are now being made.

According to this flat sealing structure, a film of an adhesive free from air bubbles is formed into a specific pattern between a panel substrate (element substrate) including an organic EL element and a sealing substrate facing the panel substrate, thereby attaching the substrates to each other. If air bubbles are generated inside the adhesive, the air bubbles might deteriorate the organic EL element. Organic EL panels having such a flat sealing structure have been disclosed as follows. According to the following organic EL panel having a flat sealing structure (refer to Japanese Kokai Publication No. 2003-178866, for example), a protective barrier (sealing material) is arranged on an attachment surface of a sealing substrate to intercept a luminous area and its peripheral electrode region of a panel substrate, and an uncured sealing resin (filler) is applied on the inner side of the protective barrier on an attachment surface of the panel substrate, and the panel substrate is attached to the sealing substrate with the protective barrier and the cured sealing resin. Further, according to the following sealing process aiming at simplification of steps (refer to Japanese Kokai Publication No. 2006-179352, for example), only a solid sealing resin instead of the liquid sealing resin (filler), which needs the protective barrier (sealing material), is used to cover each light-emitting region on a panel substrate. In addition, according to the following organic EL panel (refer to Japanese Kokai Publication No. 2004-265615, for example), an organic EL element is formed on a panel substrate, and a solid sealing resin that is a cohesive sheet made of a butyl rubber is arranged to cover and surround the organic EL element, and a sealing resin made of a UV curable epoxy resin and the like is arranged to further surround the solid sealing resin.

According to the organic EL panels in Japanese Kokai Publication No. 2003-178866 and Japanese Kokai Publication No. 2004-265615, two sealing members (corresponding to the protective barrier (sealing material) and the sealing resin (filler) in Japanese Kokai Publication No. 2003-178866, or the solid sealing resin and the sealing resin including UV curable epoxy resin and the like in Japanese Kokai Publication No. 2004-265615) are arranged as a member for sealing the organic EL element. However, the two sealing members are arranged with no space therebetween. Further, according to an organic EL panel produced by the sealing process in Japanese Kokai Publication No. 2006-179352, only a sheet-like solid sealing resin is formed as the member for sealing the organic EL element. So, in the organic EL panels in Japanese Kokai Publication No. 2003-178866 to Japanese Kokai Publication No. 2004-265615, a space is slightly generated at an interface between the protective barrier or the sealing resin and the substrate when the protective barrier or the sealing resin is cured and shrinks or when the substrates warp in high temperature and humidity environments, and due to this slight space, the entire sealing member is easily separated from the substrates. As a result, moisture, oxygen, and the like, pass through the space between the sealing member and the substrate and enter the inside of the organic EL element to deteriorate the organic EL element. Thus, the organic EL elements disclosed in Japanese Kokai Publication No. 2003-178866 to Japanese Kokai Publication No. 2004-265615 still have room for improvement.

The liquid sealing resin (filler), which is arranged on the inner side of the protective barrier (sealing material) to cover each light-emitting region on the panel substrate, as in Japanese Kokai Publication No. 2003-178866, has a low viscosity in order to improve wet-spreading property inside the protective barrier. The sealing resin is surrounded and sealed by the protective barrier although the sealing resin generates a great amount of gas when being cured, and so the generated gas deteriorates the organic EL element, and a non-light-emitting region, what is called dark spot, is generated, and as a result, the light emission cannot be maintained. Thus, the organic EL panel in Japanese Kokai Publication No. 2003-178866 needs to be improved in terms of its lifetime.

In addition, if an organic EL element that includes only a solid sealing resin as a member for sealing an organic EL element is used as an organic EL element having a top-emission structure, as in Japanese Kokai Publication No. 2006-179352, the solid sealing resin needs to have transparency, and so the solid sealing resin cannot include spacers and the like. So, it is difficult to keep a thickness (gap between the substrates) or pattern shape of the solid sealing resin constant, and uneven display that is caused by a variation in characteristics or interference fringes, due to transmittance change, is generated. In order to solve these problems, a gap-controlling member such as a photo spacer needs to be formed on either one of the substrates. Thus, there is still room for improvement.

In order to seal the gap between the substrates with the solid sealing resin free from air bubbles, the sealing needs to be performed under a vacuum condition or under a combination of reduced pressure condition and heating. Accordingly, the method in which only the solid sealing resin is used as the sealing member as in Japanese Kokai Publication No. 2006-179352 needs an apparatus for attaching the substrates under the above-mentioned conditions. So, also in terms of simplification of the apparatus, improvement in alignment accuracy of the substrates (suppression of misalignment caused by a variation in temperature), such a method has room for improvement.

SUMMARY OF THE INVENTION

In view of the above-mentioned state of the art, preferred embodiments of the present invention provide an organic EL panel, an organic EL display, an organic EL lighting device, each including an organic EL element capable of maintaining stable light emission characteristics for a long period of time, and also provide production methods thereof.

The present inventor made various investigations of an organic EL panel including an element substrate, a sealing substrate facing the element substrate, and an organic EL element arranged on the sealing substrate side of the above-mentioned element substrate. The inventor noted a configuration of a member (sealing member) that is arranged to seal the organic EL element. Then the inventor discovered the following. A space and the like are hardly generated between the second sealing member and the respective substrates even if the substrates are deformed due to environmental temperature changes and the like, and as a result, moisture and the like can be prevented from entering the inside of the organic EL element when the organic EL panel has the following configuration: the first sealing member for sealing a gap between the element substrate and the sealing substrate and the second sealing member for covering the organic EL element are arranged; the first sealing member and the second sealing member are arranged with a space therebetween. The inventor also discovered the following. If the space between the first sealing member and the second sealing member is under a vacuum or reduced pressure condition, gas inside the organic EL panel can be kept inside that space. So it is possible to prevent the organic EL element from being deteriorated by such gas. That is, the inventor discovered that the organic EL element can maintain stable light emission characteristics for a long period of time if the first sealing member and the second sealing member are arranged with a space therebetween and the space between the first sealing member and the second sealing member is under a vacuum or reduced pressure condition. As a result, the above-mentioned problems can be admirably solved, leading to development and completion of preferred embodiments of the present invention.

According to a preferred embodiment of the present invention, an organic electroluminescent panel including an element substrate; a sealing substrate facing the element substrate; and an organic electroluminescent element disposed on a sealing substrate side of the element substrate, wherein the organic electroluminescent panel further includes a first sealing member and a second sealing member, the first sealing member sealing a gap between the element substrate and the sealing substrate, the second sealing member covering the organic electroluminescent element, the first sealing member and the second sealing member being arranged with a space therebetween, the space is in a vacuum or reduced pressure state (an organic EL panel including: an element substrate; a sealing substrate facing the element substrate; an organic EL element disposed on the sealing substrate side of the element substrate; a first sealing member arranged to seal a gap between the element substrate and the sealing substrate; and a second sealing member arranged to cover the organic electroluminescent element, the first sealing member and the second sealing member being arranged with a space therebetween, the space is in a vacuum or reduced pressure state).

The organic EL panel according to a preferred embodiment of the present invention includes an element substrate, a sealing substrate facing the element substrate, and an organic EL element disposed on the sealing substrate side of the element substrate. The organic EL panel according to a preferred embodiment of the present invention has a flat sealing structure, and so, unlike the organic EL panel having a sealing can structure including a sealing can and the like, the organic EL panel according to a preferred embodiment of the present invention can be thinned and further increase an aperture ratio if it has a top-emission structure. The organic EL element has a structure in which at least organic light-emitting layer is interposed between an anode and a cathode. The order in which the organic light-emitting layer, the anode, and the cathode are stacked is not especially limited, and either the anode or the cathode may be arranged in the element substrate. If the top-emission structure is applied to the organic EL panel, a reflective electrode is arranged in the element substrate, and a transparent electrode is arranged in the sealing substrate.

The above-mentioned organic EL panel preferably includes the first sealing member and the second sealing member. The first sealing member seals a gap between the element substrate and the sealing substrate. The first sealing member and the second sealing member are arranged with a space therebetween. The second sealing member covers the organic EL element. The organic EL element is generally deteriorated by exposure to oxygen or moisture. So, the organic EL element needs to be shielded from air. According to the organic EL panel of a preferred embodiment of the present invention, the first sealing member is arranged to surround the light-emitting region where one or more organic EL elements are arranged, the second sealing member (sealing film) is arranged to cover the organic EL element on the inner side of the first sealing member (in the space sealed with the first sealing member), and as a result, the gap between the element substrate and the sealing substrate can be sufficiently sealed. That is, in the organic EL panel according to a preferred embodiment of the present invention, the organic EL element is doubly shielded from outside environment by the two sealing members: the first sealing member; and the second sealing member. Thus, the organic EL element is prevented from being deteriorated by air.

According to the above-mentioned EL panel, the space between the first sealing member and the second sealing member is in a vacuum or reduced pressure state. The organic EL panel according to a preferred embodiment of the present invention includes a flat element substrate and a sealing substrate, attached to each other, for example, in order to decrease the thickness and increase the aperture ratio. Therefore, the substrates and the like possibly deform (sag, warp, etc.) by exposure to external stress such as environmental temperature changes. However, according to the organic EL panel according to a preferred embodiment of the present invention, the space between the first sealing member and the second sealing member functions as a buffer for such external stress. So if the substrates are warped, for example, the second sealing member, which is arranged inside the organic EL panel, can be prevented from separating from the substrates, and hence, moisture and the like can not reach the organic EL element. The space between the first sealing member and the second sealing member is in a vacuum or reduced pressure state, and so, gases inside the organic EL panel such as gas that is generated, for example, when the second sealing member is cured and enclosed with the first sealing member can be kept inside the space. As a result, it is possible to prevent such gas from deteriorating the light-emitting layer constituting the organic EL element and the like.

The term "reduced pressure state" used herein means a state at a pressure of about $10^{-6}$ to 10 Pa, for example. The term "vacuum state" used herein means a state at a pressure of less than about $10^{-6}$ Pa, for example. That is, according to a preferred embodiment of the organic EL panel of the present invention, the space between the first sealing member and the second sealing member is preferably at about 10 Pa or less. Thus, the pressure in the space between the first sealing member and the second sealing member is much lower than the atmospheric pressure. So, the organic EL panel according to a preferred embodiment of the present invention generally has the following cross-sectional shape (bounding shape, refer to FIG. 4, for example): the substrates (the element substrate and the sealing substrate) sag inward at a space portion (a region corresponding to the space between the first sealing member and the second sealing member). The amount of sagging (deformation) of the substrates depends on (1) thickness of the substrates, (2) stiffness of the substrates, (3) thickness of the sealing member (the first sealing member and the second sealing member), (4) width of the space, (5) vacuum degree of the space, and the like. It is preferable that the substrates have a shape that bounds at the space portion in order to prevent the second sealing member from separating from the substrates, for example. That is, it is preferable that the element substrate and the sealing substrate sag (bound) toward the space at the region where the space is positioned. The number of the space per the organic EL panel may be one or two or more.

The first sealing member is not especially limited as long as it seals the gap between the element substrate and the sealing substrate, and generally it is a frame member arranged to attach the element substrate and the sealing substrate to each other. The second sealing member is not especially limited as long as it is arranged with a space from the first sealing member and covers the organic EL element. The second sealing member is generally a member arranged to attach the element substrate to the sealing substrate. The numbers of the first sealing member and the second sealing member may be the same or different. For example, the number of the second sealing member, which is arranged on the inner side of one first sealing member, may be one or two or more. That is, if two or more organic EL elements are surrounded by one first sealing member, the two or more organic EL elements may be covered with one second sealing member or may be covered with two or more second sealing members.

The material for the first sealing member is not especially limited. An organic material is preferable and a resin is more preferable. Examples of the resin include: epoxy resins (EP), methacrylic resins (poly(meth)acrylate), cyclic polyolefin (COP) resins, vinyl chloride resins (polyvinyl chloride, PVC), polyethylene terephthalate (PET) resins, various nylons (polyamide resins), polyimide (PI) resins, polyamide-imide (PAI) resins, polyaryl phthalate resins, silicone resins, polysulfone (PS) resins, polyphenylene sulfide (PPS) resins, polyether sulphone (PES) resins, polyurethane (PU) resins, and acetal resins (polyacetal, POM). Among these, a photocurable resin is particularly preferable. That is, it is preferable that the first sealing member includes a photocurable resin. It is more preferable that the first sealing member is composed of a photocurable resin. According to this, the first sealing member is cured without heating, and so, a reduction in yield, which is caused by misalignment and the like, can be prevented. Further, the absence of the heating leads to an improvement in reliability of the organic EL element because the organic EL element is vulnerable to heat. In addition, the curing time (takt time for curing) can be shorter than time for thermal curing. The resins exemplified as the material for the first sealing member each include the specific structure or may be a derivative thereof and the like.

The above-mentioned photocurable resin generally includes a photopolymerization initiator together with a photopolymerizable monomer and the like. For example, a photocationic polymerization initiator initiates a polymerization reaction of an epoxy resin, and a photoradical polymerization initiator and the like initiates a polymerization reaction of an acrylic resin. The amount of the photopolymerization initiator included in the photocurable resin largely depends on a material to be selected as the photopolymerizable monomer. If it is too small, the reaction might proceed insufficiently or too slowly. If it is too large, the reaction proceeds so quickly, which possibly results in a reduction in workability, heterogeneous reaction, and the like. Particularly, a UV-curable resin is preferable among the above-mentioned photocurable resins because environment under which the UV-curable resin is applied is hardly limited. The UV-curable resin is cured only by exposure to UV radiation, and so, it is excellent in workability such as work environment.

It is preferable that the first sealing member includes a spacer. As a result, the thickness and shape of the second sealing member can be cured with accuracy without letting the second sealing member include spacers or forming a gap-controlling member such as a photospacer. The first sealing member is arranged to surround the organic EL element, and in such a preferred embodiment, the spacer does not deteriorate display qualities of an organic EL display. The shape of the spacer is not especially limited, and a spherical shape is preferable in order to uniformly disperse the spacers in the first sealing member. It is preferable that the spherical spacer has an average particle size of about 1 μm to about 100 μm, for example. If the average particle size is smaller than about 1 μm, a gap between the substrates (between the element substrate and the sealing substrate) might be varied by reduction in uniform dispersibility of the spacer and uniformity of the particle size. If it is larger than about 100 μm, the thickness of the panel might be too large. In view of sealing performance or light transmittance, the average particle size of the spherical spacer is more preferably about 20 μm or less, for example.

The material for the second sealing member is not especially limited. An organic material is preferable and a resin is more preferable. Examples of the resin include: epoxy resins (EP), methacrylic resins (poly(meth)acrylate), cyclic polyolefin (COP) resins, vinyl chloride resins (polyvinyl chloride, PVC), polyethylene terephthalate (PET) resins, various nylons (polyamide resins), polyimide (PI) resins, polyamide-imide (PAI) resins, polyarylphthalate resins, silicone resins, polysulfone (PS) resins, polyphenylene sulfide (PPS) resins, polyether sulphone (PES) resins, polyurethane (PU) resins, and acetal resins (polyacetal, POM). Among these, a thermocurable resin is particularly preferable. That is, it is preferable that the second sealing member includes a thermocurable resin. It is more preferable that the second sealing member is composed of a thermocurable resin. If a material that is photopolymerized and cured by photoirradiation such as UV irradiation is used as the material for the second sealing member, the entire surface of the organic EL element is irradiated with, for example, UV rays, for polymerizing the second sealing member. In such a case, deterioration of the organic EL element is concerned. Accordingly, it is preferable that the second sealing member is thermally polymerized in order to prevent the deterioration of the organic EL element. The resins exemplified as the material for the second sealing member also have the specific structure, or may be a derivative thereof and the like.

It is preferable that a plurality of the organic electroluminescent elements are collectively covered with the second sealing member. Thus, if the second sealing member is arranged to cover a plurality of the organic EL elements, the takt time for arrangement of the second sealing member can be significantly shortened compared with a configuration in which the second sealing member is arranged for each organic EL element. The number of the organic EL elements sealed with one second sealing member is not especially limited and it is one or more. If all of the organic EL elements in the organic EL panel are surrounded by one first sealing member, all of the organic EL elements in the organic EL panel may be covered with one second sealing member.

It is preferable that the second sealing member has a thickness of about 1 μm to about 100 μm, for example. If the second sealing member has a thickness of less than about 1 μm, the gap between the substrates varies even if the first sealing member includes spacers. So, it might be difficult to uniform the thickness of the second sealing member. If the second sealing member has a thickness of more than about 100 μm, the light transmittance of the second sealing member is decreased. So if the organic EL panel including the second sealing member having a thickness of more than about 100 μm has a top-emission structure, the amount of light outputted from the organic EL element might be decreased. The thickness of the second sealing member used herein is an average thickness of the second sealing member. The upper limit of the thickness of the second sealing member is more preferably about 20 μm, for example.

It is preferable that the second sealing member has a light transmittance of about 80% or more in the visible wavelength range, for example. Such a configuration is preferably applied to the organic EL panel according to a preferred embodiment of the present invention if the organic EL panel includes an organic EL element having a top-emission structure, which can provide a high aperture ratio. The "visible wavelength range" used herein is a wavelength range of 380 nm to 780 nm, for example. The "light transmittance in the visible wavelength range" is a transmittance for visible light at 380 nm to 780 nm, measured with a spectrophotometer (trade name: U-4000, product of Hitachi, Ltd.) in accordance with JIS R 3106 "Testing method on transmittance of flat glasses".

It is preferable that a difference in linear expansion coefficient (coefficient of linear expansion) between the first sealing member and the second sealing member is as small as possible. The difference in linear expansion coefficient between the first sealing member and the second sealing member is preferably approximately $1.0 \times 10^{-4} (K^{-1})$ or less. A common sealing resin has a linear expansion coefficient (coefficient of linear expansion) of approximately $2.0 \times 10^{-5}$ to $9.0 \times 10^{-5}$ $(K^{-1})$, for example. According to this preferred embodiment, the material for the first sealing member and the material for the second sealing member preferably have almost the same linear expansion coefficient. In such a preferred embodiment, even if a temperature is sharply changed or an external force is applied to the respective sealing members, the second sealing member changes its volume in accordance with expansion or contraction of the volume of the first sealing member. As a result, generation of the gap between the second sealing member and the substrates (separation of the second sealing member from the substrates) can be prevented.

It is preferable that a difference in linear expansion coefficient is as small as possible among materials for the element substrate, the sealing substrate, the first sealing member, and the second sealing member. It is preferable that a difference in linear expansion coefficient among the first sealing member, the second sealing member, the element substrate, and the sealing substrate is approximately $1.0 \times 10^{-4} (K^{-1})$ or less. As a result, the space that is formed by separation of the sealing member from the substrates is hardly generated. What is called a flexible substrate such as a plastic substrate has a larger linear expansion coefficient than that of a glass substrate, and further an amount of deformation that is caused by temperature changes or external force of the flexible substrate is also larger than that of the glass substrate. For example, a glass substrate (trade name: 1737, product of Corning Incorporation) has a linear expansion coefficient of $3.8 \times 10^{-6} (K^{-1})$, and a polyether sulfone (PES) resin substrate (trade name: SUMILITE FS-5300, product of SUMITOMO BAKELITE Co., Ltd.) has a linear expansion coefficient of $5.4 \times 10^{-5}$ $(K^{-1})$. So if a flexible substrate is used as the element substrate and the sealing substrate, the substrates and the sealing members have almost the same linear expansion coefficient. As a method of measuring the linear expansion coefficient, a method of using a push rod dilatometer and a photo-interference method, and the like, are mentioned. As a preferred embodiment in which the difference in linear expansion coefficient between the material for the element substrate and that for the sealing substrate is small, for example, a preferred embodiment in which the same material is used for the element substrate and the sealing substrate.

It is preferable that the organic electroluminescent panel has a top-emission structure. The top-emission structure is preferably used for increases in aperture ratio because light emitted by the organic EL element can be outputted without passing through the element substrate in which a circuit for driving the organic EL element is arranged. According to such a preferred embodiment, it is preferable in view of high aperture ratio that each of the second sealing member and the sealing substrate has a light transmittance of about 80% or more in the visible wavelength range, for example.

The configuration of the organic EL panel according to various preferred embodiments of the present invention is not especially limited as long as it includes the above-mentioned organic EL element, the element substrate, the sealing substrate, the first sealing member, and the second sealing member, as components. The organic EL panel according to various preferred embodiments of the present invention may or may not include other components.

Other preferred embodiments of the present invention provide an organic EL display or an organic EL lighting device each including the above-mentioned organic EL panel. Such an organic EL display and organic EL lighting device each exhibit stable light-emission characteristics for a long period of time, attributed to the organic EL element.

The organic EL display and the organic EL lighting device according to various preferred embodiments of the present invention are not especially limited as long as each includes the above-mentioned organic EL panel as a component. The organic EL display and the organic EL lighting device may or may not include other components. As one preferred embodiment of the organic EL display and the organic EL lighting device of the present invention, a preferred embodiment in which each includes the above-mentioned organic EL panel and a driver IC is provided. The driver IC is not especially limited as long as it is a circuit or IC for driving the organic EL panel. A scanning driver IC, a signal driver IC, and the like, are mentioned as the driver IC.

Yet another preferred embodiment of the present invention provides a method for producing an organic electroluminescent panel by attaching an element substrate including an organic electroluminescent element to a sealing substrate, the method including: a solid sealing member-arranging step of arranging a solid sealing member on the organic electroluminescent element; a liquid adhesive-arranging step of arranging a liquid adhesive around the solid sealing member; an attachment step of attaching the sealing substrate to the element substrate with the solid sealing member and the liquid adhesive in a vacuum or reduced pressure environment; a liquid adhesive-curing step of curing the liquid adhesive in an inert gas atmosphere; and a solid sealing member-curing step of curing the solid sealing member after the liquid adhesive-curing step.

In the above-mentioned solid sealing member-arranging step, the solid sealing member is arranged to cover the organic EL element. The solid sealing member is cured later, thereby sealing the organic EL element. Due to use of the solid sealing member, the takt time for arrangement of the sealing member can be significantly shortened compared with the case that the liquid sealing member is used. It is preferable that the solid sealing member-arranging step is performed in a vacuum or reduced pressure environment. If the solid sealing member-arranging step is performed in an atmospheric environment, for example, under air, the solid sealing member absorbs moisture and further, air and the like enters the sealed space. So, a step of removing the moisture from the solid sealing member, or a step of performing degassing for a long time might need to be performed after the attachment step.

The term "solid sealing member" used herein is a sealing member having a certain shape and volume. The solid sealing member may not have an adhesive property as long as it is arranged to cover the organic EL element and it is cured to attach (connect) the element substrate to the sealing substrate, thereby sealing the organic EL element. It is preferable that the solid sealing member has an adhesive property. If the solid sealing member has no adhesive property, the following problems possibly occur. The substrates and the like deform (sag, warp, etc.), for example, by being moved or by a change in environment from the vacuum or reduced pressure environment to the inert gas atmosphere when the process goes from the production step to the liquid adhesive-curing step from the attachment step. As a result, due to misalignment between the element substrate and the sealing substrate or stress concentration to the liquid adhesive, an air hole is formed at a portion where the substrates are attached to each other with the liquid adhesive therebetween, and air might enter the sealed space through the air hole. The following preferred embodiments are mentioned as preferred embodiments of the solid sealing member with an adhesive property, for example. (1) A preferred embodiment in which the solid sealing member itself has an adhesive property; (2) a preferred embodiment in which a liquid adhesive is applied on a surface of the solid sealing member; and (3) a preferred embodiment in which a liquid adhesive is solidified to define the solid sealing member. A lamination method, a pressing method, and a roll-to-roll method are mentioned as possible arrangement methods of the solid sealing member, for example. The solid sealing member may be arranged on the element substrate or the sealing substrate as long as it is arranged to cover the organic EL element. It is preferable that the solid sealing member is arranged on the sealing substrate in order to prevent the deterioration of the organic EL element.

In the above-mentioned liquid adhesive-arranging step, a liquid adhesive is arranged around the solid sealing member. The liquid adhesive is arranged around the solid sealing member, and by curing the liquid adhesive later, the cured product of the liquid adhesive can shield the organic EL element and the solid sealing member from air. Attributed to the cured product of the liquid adhesive, which is formed around the solid sealing member, the thickness of the solid sealing member can be kept substantially uniform. Further, the use of the liquid adhesive can prevent misalignment between the element substrate and the sealing substrate due to their thermoplasticity, which is concerned when a solid adhesive is used. It is preferable that the liquid adhesive-arranging step is performed in a vacuum or reduced pressure environment for the same reason as in the solid sealing member-arranging step.

The "liquid adhesive" used herein is an adhesive with fluidity. Examples of a method of arranging the liquid adhesive include: injection of the liquid adhesive with a dispenser; and a screen printing method. The substrate where the liquid adhesive is arranged may be either the element substrate or the sealing substrate as long as the liquid adhesive is arranged around the solid sealing member. Preferably, the liquid adhesive is arranged in the substrate (sealing substrate) where the organic EL element is not arranged. In addition, the substrate where the liquid adhesive is arranged may be either the substrate where the solid sealing member is arranged or the substrate where the solid sealing member is not arranged as long as the liquid adhesive is arranged around the solid sealing member. Preferably, the liquid adhesive is arranged in the substrate where the solid sealing member is not arranged. The reason for this is as follows: if the liquid adhesive is applied in the substrate where the solid sealing member is arranged, a misalignment amount at the time of the attachment of the substrates does not need to be taken into consideration, and so the liquid adhesive can be applied to the solid sealing member, which is arranged in the substrate, with higher accuracy. A region "around the solid sealing member" used herein may be a region in contact with the region where the solid sealing member is positioned, or may be a region away from the solid sealing member.

In the above-mentioned attachment step, the element substrate is attached to the sealing substrate with the solid sealing member and the liquid adhesive in a vacuum or reduced pressure environment. If the attachment step is performed in a vacuum or reduced pressure environment, the element substrate and the sealing substrate can be attached to each other without generating air bubbles inside the liquid adhesive. It is preferable that the attachment step is performed at normal temperatures in order to ensure alignment accuracy. It is preferable that the attachment step is performed in the presence of an inert gas and in a vacuum or reduced pressure environment.

In the liquid adhesive-curing step, the liquid adhesive is cured in an inert gas atmosphere. If the liquid adhesive-curing step is performed in an inert gas atmosphere, deterioration of the organic EL element, attributed to that the liquid adhesive before curing absorbs moisture, oxygen, and the like, can be prevented. The organic EL element can be shielded from air by the cured product of the liquid adhesive, and so, the successive solid sealing member-curing step can be performed under air without exposing the organic EL element to air. In the liquid adhesive-curing step, the liquid adhesive is not necessarily cured perfectly, as long as it is cured enough to shield the organic EL element and the solid sealing member from air. For example, the liquid adhesive may be temporarily cured in the liquid adhesive-curing step and then completely cured together with the solid sealing member in the solid sealing member-curing step. It is preferable that the liquid adhesive-curing step is performed in the presence of an inert gas and in a vacuum or reduced pressure environment. The inert gas is a gas that has a small content of at least one of oxygen and moisture, which deteriorates the organic EL element, compared with air. Nitrogen ($N_2$) gas, dry air, and the like, are mentioned as the inert gas, for example.

In the above-mentioned solid sealing member-curing step, the solid sealing member is cured after the liquid adhesive-curing step. Thus, the solid sealing member-curing step is performed after the liquid adhesive-curing step, and so, even if the organic EL panel is exposed to air after the liquid adhesive-curing step, the solid sealing member can be cured while the organic EL element and the solid sealing member are shielded from air by the cured product of the liquid adhesive. That is, the environment in which the solid sealing member is cured does not need to be controlled. As a result, the production steps can be easily performed at low costs. In addition, according to the organic EL panel that is produced by the production method of the organic EL panel according to a preferred embodiment of the present invention, the organic EL element can maintain stable light emission characteristics for a long period of time because it is sealed by both of the cured product of the solid sealing member and the cured product of the liquid adhesive.

The production method of the organic EL panel according to preferred embodiments of the present invention is not especially limited as long as it essentially includes the solid sealing member-arranging step, the liquid adhesive-arranging step, the attachment step, the liquid adhesive-curing step, and the solid sealing member-curing step. The production method may or may not include other steps. Which step is performed first, the solid sealing member-arranging step or the liquid adhesive-arranging step, is not especially limited, for example. It is preferable that the solid sealing member-arranging step is performed and then the liquid adhesive-arranging step is performed, in order to ensure accuracy of alignment of the element substrate and the sealing substrate. If the organic EL panel according to a preferred embodiment of the present invention is produced by the production method of the organic EL panel according to another preferred embodiment of the present invention, the liquid adhesive is arranged with a space from the solid sealing member in the liquid adhesive-arranging step.

Preferred embodiments of the production method of the organic EL panel according to a preferred embodiment of the present invention are described below.

It is preferable that in the solid sealing member-arranging step, a plurality of the organic electroluminescent elements are collectively covered with the solid sealing member. Thus, if the solid sealing member is arranged to cover a plurality of the organic EL elements, the takt time for arrangement of the solid sealing member can be significantly shortened compared with the configuration in which the solid sealing member is arranged per the organic EL element. The number of the organic EL elements sealed by each solid sealing member is not especially limited, and may be one or more.

It is preferable that in the liquid adhesive-arranging step, the liquid adhesive and the solid sealing member are arranged with a space therebetween as viewed in plan. If the liquid adhesive is arranged in contact with the solid sealing member, the liquid adhesive enters the space between the solid sealing member and the organic EL element or the space between the organic EL element and the element substrate, which possibly deteriorates the organic EL element. Accordingly, the liquid adhesive and the solid sealing member are arranged with a space therebetween as viewed in plane, and thereby the deterioration of the organic EL element can be prevented.

It is preferable that the liquid adhesive includes a photocurable resin, and in the liquid adhesive-curing step, the liquid adhesive is cured by photoirradiation. According to this, the liquid adhesive is cured without heat, and so the reduction in yield, due to misalignment and the like, can be minimized. Further, the absence of the heating leads to an improvement in reliability of the organic EL element because the organic EL element is vulnerable to heat. In addition, the curing time (takt time for curing) can be shortened compared with the time for thermal curing.

It is preferable that the liquid adhesive includes a spacer. As a result, in an airtight space sealed with the cured liquid adhesive, the solid sealing member can be cured while its thickness and shape are adjusted with accuracy. In addition, a gap-controlling member such as a photospacer, which is arranged to control the thickness or shape of the solid sealing member, does not need to be formed on the element substrate. As a result, the production processes can be simplified. The average particle size of the spacer is more preferably about 1 µm or more and about 100 µm or less, for example. The spacer may be sprayed in the liquid adhesive before the liquid adhesive-arranging step, or alternatively, the spacer is dispersed in the liquid adhesive and then the liquid adhesive-arranging step is performed.

It is preferable that in the solid sealing member-curing step, the solid sealing member is softened and then cured. Thus, the solid sealing member is once softened and then cured, and thereby, the solid sealing member more closely conforms to irregularities of the substrates. Accordingly, if the substrates are deformed when the environment under which the organic EL panel exists is changed from the vacuum or reduced pressure environment to air environment, the solid sealing member can follow the deformation of the substrates. So, generation and contamination of vacuum bubbles at the interface between the substrate and the solid sealing member can be prevented. In this case, it is more preferable that the solid sealing member has thermoplasticity (softens by heating). According to this, the solid sealing member can be more easily softened by heating.

It is preferable that in the solid sealing member-curing step, the solid sealing member is cured by polymerization. Thus, molecules of a compound constituting the solid sealing member are polymerized to cure the solid sealing member, and thereby a moisture permeability of the solid sealing member can be reduced. As a result, the sealing performances can be more improved.

If the solid sealing member is cured by thermopolymerization, misalignment between the substrates, attributed to heat distribution, might occur. In addition, the organic EL element is vulnerable to heat, and so its reliability might be reduced. Further, the time for thermocuring (takt time) might be longer than that for photocuring. It is preferable that in the solid sealing member-curing step, the solid sealing member is cured by photopolymerization in order to suppress the misalignment, the reduction in reliability, and to shorten the takt time.

If the solid sealing member is cured by photopolymerization, the entire surface of the organic EL element is irradiated with UV rays and the like to polymerize molecules of a compound constituting the solid sealing member. In such a case, deterioration of the organic EL element is concerned. Accordingly, in order to prevent the organic EL element from being deteriorated by photoirradiation, it is preferable that in the solid sealing member-curing step, the solid sealing member is cured by thermopolymerization.

The following preferred embodiments (1) and (2) are mentioned as more preferable embodiments of the production method of the organic EL panel of the present invention. (1) The liquid adhesive includes a photocurable resin; in the liquid adhesive-curing step, the liquid adhesive is cured by photoirradiation; and in the solid sealing member-curing step, the solid sealing member is softened by heating, and then cured by photopolymerization. (2) The liquid adhesive includes a photocurable resin; in the liquid adhesive-curing step, the liquid adhesive is cured by photoirradiation; and in the solid sealing member-curing step, the solid sealing member is cured by thermopolymerization.

According to the above-mentioned preferred embodiment (1), the liquid adhesive is cured while the solid sealing member is covered with a mask and the like so as not to be cured by the photoirradiation in the liquid adhesive-curing step.

Further, in the solid sealing member-curing step, the solid sealing member is softened (for example, the substrates are heated, thereby getting the solid sealing member to exhibit its thermoplasticity), and then, the solid sealing member is cured by photoirradiation. According to such processes, the heating time is reduced, and therefore the takt time can be shortened.

According to the above-mentioned preferred embodiment (2), the liquid adhesive can be cured without covering the solid sealing member with a mask and the like in the liquid adhesive-curing step. So, the processes can be simplified. According to this preferred embodiment, a heating treatment is preferably used to thermally polymerize the solid sealing member. In such a preferred embodiment, the liquid adhesive is cured and so the organic EL element and the solid sealing member can be kept in a reduced pressure environment and misalignment does not occur. So the solid sealing member can be cured for a longer heating time under air through a batch process (a plurality of substrates can be simultaneously subjected to the treatment) that uses a cassette and the like.

It is preferable that a cured product of the solid sealing member has a light transmittance of about 80% or more in the visible wavelength range, for example. This preferred embodiment is preferably applied to production of a top-emitting organic EL element, in which a high aperture ratio can be obtained.

A further preferred embodiment of the present invention provides a production method of an organic electroluminescent display or a production method of an organic EL lighting device, each including the above-mentioned production method of the organic electroluminescent panel. According to the production method, an organic EL display device and an organic EL lighting device each including the organic EL element that can be produced through simple production steps at low costs and that can keep stable light emission characteristics for a long period of time can be produced.

The various technical ideas and concepts of preferred embodiments of the present invention can be applied to various devices that include an element that is preferably shielded from air on a substrate, in addition to the organic EL panel. Such devices to which the technical ideas and concepts are applied are as follows, for example: a microcapsule electrophoresis display; an electronic paper display (paper-like display) having polymer network liquid crystals and the like; a light-emitting diode (LED); a plasma display; an inorganic EL display; an electronic ink (E ink); and a solar cell.

According to the organic EL panel of various preferred embodiments of the present invention, even if the substrate is warped by external stress, for example, the space between the first sealing member and the second sealing member functions as a buffer, and so separation of the second sealing member (sealing film) formed inside the organic EL panel can be prevented, for example. As a result, moisture and the like can be prevented from reaching the organic EL element. The space between the first sealing member and the second sealing member is in a vacuum or reduced pressure state, and so gas inside the organic EL panel can be kept inside the space. Accordingly, deterioration of the light-emitting layer of the organic EL element, and the like, due to such gas, can be prevented. Hence, the organic EL panel according to various preferred embodiments of the present invention can maintain stable light emission characteristics for a long period of time.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

The organic EL panel and the production method thereof are described in more detail below with reference to preferred embodiments. However, the present invention is not limited to only these preferred embodiments.

Preferred Embodiment 1

Figure 1A:
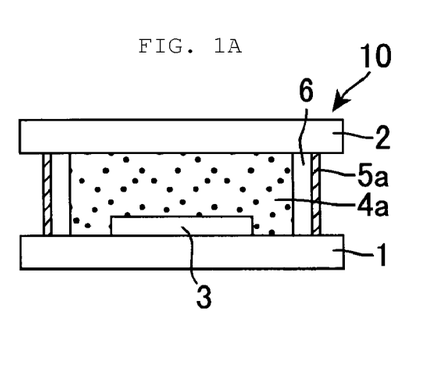
FIG. 1A is a cross-sectional view schematically showing a configuration of the organic EL panel in accordance with Preferred Embodiment 1.
Figure 1B:
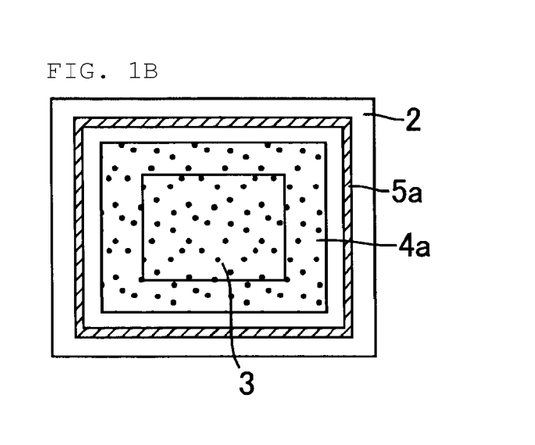
FIG. 1B is a schematic plan view of the organic EL panel of FIG. 1A.

FIG. 1A is a cross-sectional view schematically showing a configuration of an organic EL panel in accordance with Preferred Embodiment 1. FIG. 1B is a schematic plan view thereof.

As shown in FIGS. 1A and 1B, an organic EL panel 10 in accordance with Preferred Embodiment 1 preferably includes: a flat element glass (element substrate) 1; a flat sealing glass (sealing substrate) 2 facing the element glass 1; an organic EL element 3 arranged on the sealing glass 2 side of the element glass 1; a cured product (the first sealing member) 5a of a liquid sealing member (airtight seal, liquid adhesive) arranged to seal a gap between the element glass 1 and the sealing glass 2; a cured product (the second sealing member) 4a of a solid sealing member that is arranged to cover the organic EL element 3 and that forms a vacuum or reduced pressure space 6 between itself and the cured product 5a of the liquid sealing member. In FIGS. 1A and 1B, only one organic EL element 3 that is arranged on the element glass 1 is shown, but in fact, a plurality of organic EL elements are arranged on the element glass 1 in longitudinal and transverse directions.

According to the present preferred embodiment, a glass substrate (trade name: 1737, thickness: 0.7 mm, linear expansion coefficient: $3.8 \times 10^{-6}$ ($K^{-1}$), product of Corning Incorporation) is preferably used as the element glass 1, for example. The element substrate may not be necessarily a glass substrate, and it may be a flexible substrate such as a substrate made of polyether sulfone (PES) resin (trade name: SUMILITE FS-5300, thickness: 0.2 mm, linear expansion coefficient: $5.4 \times 10^{-5} (K^{-1})$, product of SUMITOMO BAKELITE Co., Ltd.). A glass substrate (trade name: 1737, thickness: 0.7 mm, linear expansion coefficient: $3.8 \times 10^{-6} (K^{-1})$, product of Corning Incorporation) is preferably used as the sealing glass 2, for example. The sealing substrate may not be necessarily the glass substrate, either, and it may be a flexible substrate such as a substrate made of PES resin.

The organic EL element 3 has a structure in which an organic light-emitting layer is interposed between an anode and a cathode. In FIGS. 1A and 1B, the organic EL element 3 is directly arranged on the element glass 1. In practice, however, various wirings and the like, used for driving the organic EL element 3 are arranged on the element glass 1, and thereon, the organic EL element 3 is arranged with an insulating film and the like therebetween.

The cured product (the second sealing member) 4a of the solid sealing member is preferably made of a thermocurable resin (linear expansion coefficient: $7 \times 10^{-5}$ $(K^{-1})$) mainly containing an epoxy resin (EP). The cured product 4a is arranged to cover almost the entire surface of the organic EL element 3 except for a terminal portion that is connected to a signal line on the element glass 1. Another thermocurable resin other than the epoxy resin may be used as the material for the cured product 4a of the solid sealing member. The thermocurable resin is softened and it can be deformed when it is heated. However, it is cured by a chemical reaction when the heating is continued. The cured production 4a of the solid sealing member may be provided with a drying function by addition of a desiccant, for example.

The cured product (the first sealing member) 5a of the liquid sealing member is preferably made of a photocurable resin mainly containing an epoxy resin (EP) (trade name: XNR5516, linear expansion coefficient: $7 \times 10^{-5} (K^{-1})$, product of Nagase Chemtex Corp.), for example, and it is arranged to surround the cured product 4a of the solid sealing member on the element glass 1. A UV (ultraviolet ray)-curable resin other than the epoxy resin may be used as a material for the cured product 5a of the liquid sealing member, and an acrylic resin and the like may be used, for example. The element glass 1 and the sealing glass 2 are attached to each other with the solid sealing member and the liquid sealing member therebetween.

According to the organic EL panel of the present preferred embodiment, the organic EL element 3 is doubly sealed by the cured product 5a of the liquid sealing member and the cured product 4a of the solid sealing member. In addition, a vacuum or reduced pressure space 6 is formed between the cured product 5a of the liquid sealing member and the cured product 4a of the solid sealing member.

Figure 6A:
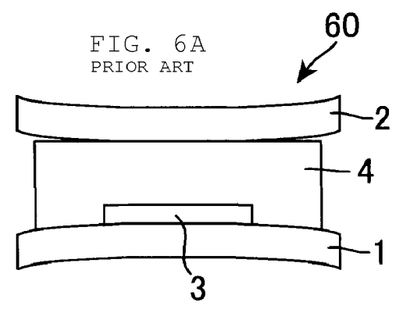
FIG. 6A is a cross-sectional view schematically showing the conventional organic EL panel having a flat sealing structure.
Figure 6B:
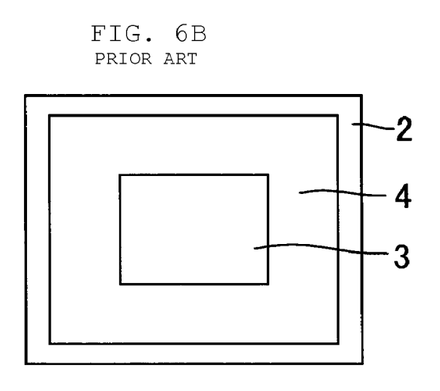
FIG. 6B is a schematic plan view of the conventional organic EL panel of FIG. 6A.

The organic EL panel in the present preferred embodiment having the above-mentioned configuration (hereinafter, also referred to as a "panel of the present invention") and an organic EL panel having a conventional structure (hereinafter, also referred to as a "conventional panel") were put into a test tank that was under high temperature and humidity conditions of 85° C. and 85% for 500 hours. The existence of a dark spot (non-emission portion of the organic EL element) was checked by eye observation, and the organic EL panels before and after being put into the test tank were compared with each other. According to the panel of a preferred embodiment of the present invention, a vacuum space is formed between the cured product 5a of the liquid sealing member and the cured product 4a of the solid sealing member, as shown in FIGS. 1A and 1B. According to the conventional panel, as shown in FIGS. 6A and 6B, only the solid sealing member is used for sealing, and no vacuum space is formed. Accordingly, the conventional panel includes no liquid sealing member.

The dimensions of the respective members of the panel of an example of a preferred embodiment of the present invention and the conventional panel are as follows.

Substrate: 25 mm×25 mm, 0.7 mm in thickness
Organic EL layer: 15 mm×15 mm
The first sealing member of the panel of an example of a preferred embodiment of the present invention: frame with 2 mm in width (outline dimensions: 23 mm×23 mm), 12 μm in thickness
The second sealing member of the panel of an example of a preferred embodiment of the present invention: 20 mm×20 mm, 12 μm in thickness
The second sealing member of the conventional panel: 23 mm×23 mm, 12 μm in thickness Table 1 shows the test results. As shown in Table 1, the organic EL panel in the present preferred embodiment had no dark spots even 500 hours later. In contrast, the organic EL panel having the conventional configuration was observed to have dark spots 100 hours later, and light emission was not observed 500 hours later.

TABLE 1

| | Existence of dark spot | | |
|---|---|---|---|
| | Early stage | 100 hours later | 500 hours later |
| Panel in the present invention | No exist | No exist | No exist |
| Conventional panel | No exist | Slightly exist (area ratio of non-emitting region was 10 to 20%) | Exist (No emission) |

The following technical reasons support the above-mentioned test results.

The organic EL panel in the present preferred embodiment has the vacuum or reduced pressure space 6 thereinside. The vacuum or reduced pressure space 6 functions as a buffer for external stress even if the element glass 1 and the sealing glass 2 are deformed (sagged, warped, for example) by external stress such as change in environment temperature, curing shrinkage of the solid sealing member, and the like. As a result, unlike the conventional organic EL panel 60 in FIGS. 6A and 6B, it is possible to prevent the cured product 4a of the solid sealing member from being separated from the substrates, for example, and so, the organic EL element 3 is not likely to be deteriorated by oxygen, moisture, and the like.

Gas generated on the inner side of the cured product 5a of the liquid sealing member such as gas generated when the solid sealing member is cured is absorbed in the vacuum or reduced pressure space 6. Hence, the organic EL element 3 is not likely to be deteriorated. According to the present preferred embodiment, a difference in linear expansion coefficient between the cured product 4a of the solid sealing member and the cured product 5a of the liquid sealing member preferably is about $1.0 \times 10^{-4} (K^{-1})$ or less, for example. So, even if a temperature is sharply changed or an external force is locally applied to the substrates, the cured product 4a of the solid sealing member changes its volume in accordance with expansion or contraction of the volume of the cured product 5a of the liquid sealing member. Hence, the cured product 4a of the solid sealing member can be prevented from separating from the element glass 1 or the sealing glass 2.

Figure 4:
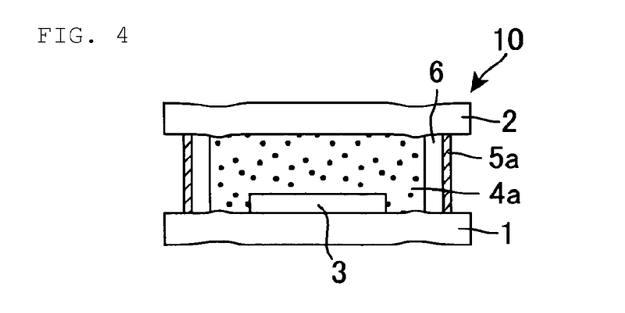
FIG. 4 is a cross-sectional view schematically showing another configuration of the organic EL panel in accordance with Preferred Embodiment 1.

If a flexible substrate such as a plastic substrate is used as the element substrate and the sealing substrate, instead of the glass substrate, the difference in linear expansion coefficient among the element substrate, the sealing substrate, the cured product 4a of the solid sealing member, and the cured product 5a of the liquid sealing member can be about $1.0 \times 10^{-4} (K^{-1})$ or less, for example. Accordingly, the cured product 4a of the solid sealing member is not likely to separate from the substrates. In this case, as shown in FIG. 4, the element substrate and the sealing substrate tend to have a shape that sags inward (bounding shape), which can more effectively suppress separation of the cured product 4a of the solid sealing member from the substrate, for example. In addition, if a preferred embodiment in which the cured product 4a of the solid sealing member has a thickness of about 100 μm or less and it has a light transmittance of about 80% or more in the visible wavelength range is applied to an organic EL panel having a top emission structure, which can increase an aperture ratio, such a panel can exhibit excellent display qualities.

FIGS. 2A to 2G are cross-sectional views schematically showing one example of production steps of the organic EL panel in accordance with Preferred Embodiment 1.

Figure 2A:
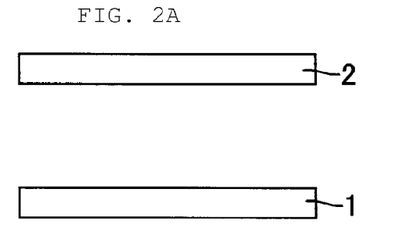
FIGS. 2A to 2G are cross-sectional views schematically showing one example of production steps of the organic EL panel in accordance with Preferred Embodiment 1.

The element glass (element substrate) 1 and the sealing glass (sealing substrate) 2 are prepared first, as shown in FIG. 2A.

Figure 2B:
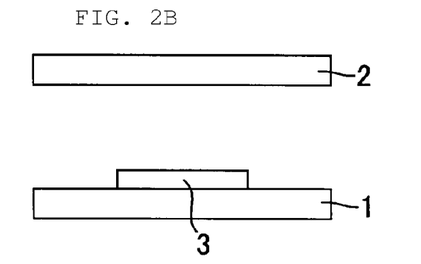

Then the organic EL element 3 is arranged on the element glass 1, as shown in FIG. 2B.

Figure 2C:
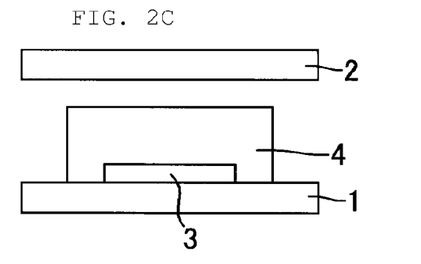

As shown in FIG. 2C, the thermocurable solid sealing member 4 mainly containing epoxy resin is laminated on the organic EL element 3 (solid sealing member-arranging step). The solid sealing member 4 is arranged to cover almost the entire surface of the organic EL element 3 except for a terminal portion that is connected to a signal line on the element glass 1. The solid sealing member 4 from which an unnecessary portion is cut and removed is arranged on the organic EL element 3, or the solid sealing member 4 is arranged on the organic EL element 3 and then an unnecessary portion is cut and removed from the solid sealing member 4.

Figure 2D:
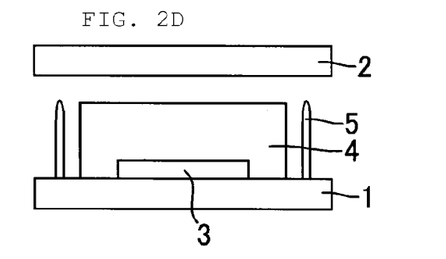

Then the photocurable liquid sealing member 5 is applied on the element glass 1 with a dispenser, as shown in FIG. 2D (liquid adhesive-arranging step). According to the present preferred embodiment, the solid sealing member 4 and the liquid sealing member 5 are arranged with a space therebetween. Hence, the deterioration of the organic EL element 3, which is attributed to that the liquid sealing member 5 enters a space between the solid sealing member 4 and the organic EL element 3 or a space between the organic EL element 3 and the element glass 1, can be prevented.

Figure 2E:
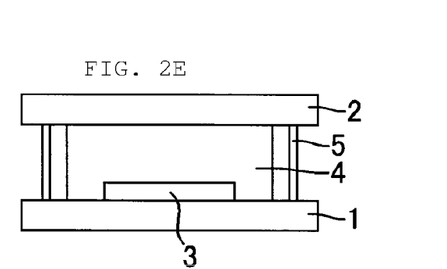

Then the element glass 1 is attached to the sealing glass 2 with the solid sealing member 4 and the liquid sealing member 5 therebetween at normal temperatures in a vacuum or reduced pressure environment and in the presence of an inert gas such as nitrogen ($N_2$) gas and dry air, as shown in FIG. 2E (attachment step). If this step is performed in a vacuum or reduced pressure environment, the element glass 1 can be attached to the sealing glass 2 without generating air bubbles inside the liquid sealing member 5 and on the contact face between the solid sealing member 4 and the element glass 1. In addition, if this step is performed at normal temperatures, a reduction in yield that might be caused by misalignment and the like can be minimized and prevented and further, the takt time for this step can be significantly shortened.

Figure 2F:
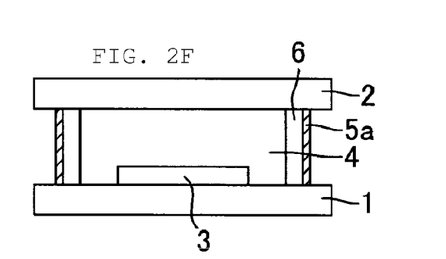

Then in a vacuum or reduced pressure environment in the presence of an inert gas such as nitrogen ($N_2$) gas and dry air, the liquid sealing member 5 is cured by UV rays, as shown in FIG. 2F (liquid adhesive-curing step). As a result, the liquid sealing member 5 is cured to be a cured product (the first sealing member) 5a of the liquid sealing member. As a result, the cured product 5a of the liquid sealing member shields the organic EL element 3 and the solid sealing member 4 from air, which can prevent moisture, oxygen, and the like from adsorbing to the organic EL element 3. As a result, the successive solid sealing member-curing step can be performed under air. The liquid sealing member 5 is not cured by heating, and so the takt time of this step can be significantly shortened without reduction in yield that might be caused by misalignment and the like. The organic EL element 3 is vulnerable to heat, and so the absence of the heating leads to an improvement in reliability of the organic EL element 3.

Figure 2G:
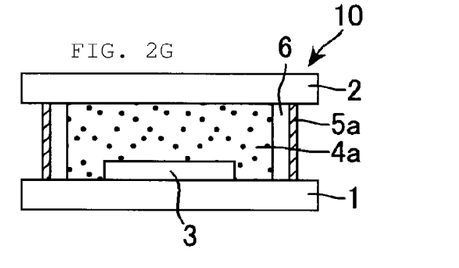

Then in an air environment, the solid sealing member 4, which is surrounded by the cured product 5a of the liquid sealing member and which is kept in a vacuum or reduced pressure environment, is once softened by heating and finally cured, as shown in FIG. 2G (solid sealing member-curing step). As a result, the solid sealing member 4 is cured to be a cured product (the second sealing member) 4a of the solid sealing member. As a result, the organic EL panel 10 is completed.

According to a production method of the organic EL panel in accordance with Preferred Embodiment 1, the environment in which the solid sealing member 4 is cured does not need to be controlled. Further, the thermocurable solid sealing member 4 can be cured by heating under air. So the production processes are greatly simplified. Neither the attachment step nor the curing step of the liquid sealing member 5 needs the heating treatment, and so, even if the sealing glass 2 that includes a color filter and the like needs to be aligned with the element glass 1 with a high accuracy, the takt time for the production steps can be significantly shortened without the reduction in yield that might be caused by misalignment.

Preferred Embodiment 2

FIGS. 3A to 3D are perspective views schematically showing production steps of an organic EL panel in accordance with Preferred Embodiment 2.

Figure 3A:
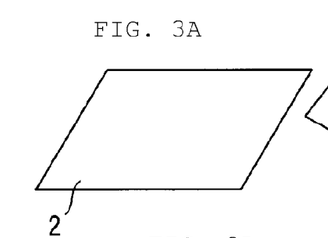
FIGS. 3A to 3D are cross-sectional views schematically showing the production steps of the organic EL panel in accordance with Preferred Embodiment 2.

The sealing glass (sealing substrate) 2 is produced first, as shown in FIG. 3A.

Then, although not shown in FIG. 3A, a plurality of organic EL elements are arranged on the element glass (element substrate).

Figures 3B, 3C:
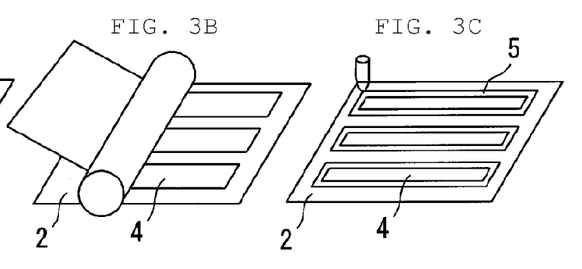

Then the solid sealing member 4 is arranged on the sealing glass 2 by roll-to-roll method, as shown in FIG. 3B (solid sealing member-arranging step). The solid sealing member 4 is arranged in such a way that it covers a plurality of organic EL elements 3 after the element glass 1 is attached to the sealing glass 2. Thus, the plurality of organic EL elements 3 are covered by a common solid sealing member 4, and thereby the takt time for the attachment of the solid sealing member 4 can be significantly shortened compared to the case that the organic EL elements 3 are each covered by different solid sealing members 4.

Then as shown in FIG. 3C, the liquid sealing member (liquid adhesive) 5 is applied on the sealing glass 2 with a dispenser (liquid adhesive-arranging step). In this case, the liquid sealing member 5 is applied to have a space from the solid sealing member 4, which is common to the plurality of organic EL elements 3, and surround the solid sealing member 4. Accordingly, the takt time for application of the liquid sealing member 5 can be significantly shortened compared to the case that the liquid sealing member 5 is applied to surround each organic EL element 3.

Figure 3D:
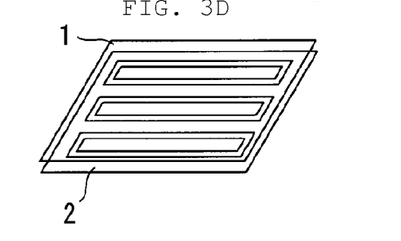

Then the element glass 1 is attached to the sealing glass 2 with the solid sealing member 4 and the liquid sealing member 5 therebetween at normal temperatures in a vacuum or reduced pressure environment, as shown in FIG. 3D (attachment step). Then the liquid sealing member 5 is cured by UV rays (liquid adhesive-curing step).

Then in an air environment, the solid sealing member 4, which is surrounded by the cured liquid sealing member (the first sealing member) 5 and which is kept in a vacuum or reduced pressure environment in the presence of an inert gas, is once softened by heating and finally cured (solid sealing member-curing step).

As a result, the organic EL panel 10 is completed.

According to the production method of the organic EL panel in accordance with Preferred Embodiment 2, such an advantage that the takt time for the attachment of the solid sealing member 4, the application of the liquid sealing member 5, and the like can be significantly shortened, can be obtained in addition to the effect obtained in Preferred Embodiment 1, because the solid sealing member 4 and the liquid sealing member 5, each of which is common to the plurality of organic EL elements 3, are arranged.

Preferred Embodiment 3

Figure 5A:
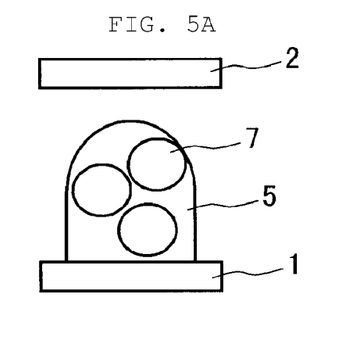
FIG. 5A is a cross-sectional view schematically showing a state where the liquid sealing member including the spacers is arranged on the element glass or the sealing glass.
Figure 5B:
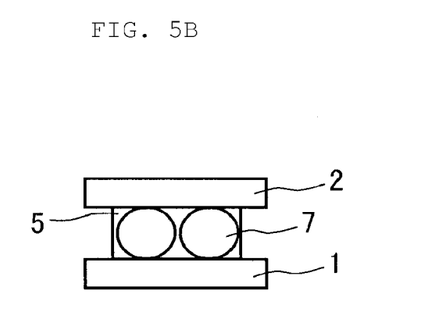
FIG. 5B is a cross-sectional view schematically showing a state where the element glass is attached to the sealing glass after the liquid sealing member is arranged.

FIG. 5A is a cross-sectional view schematically showing a state that a liquid sealing member including spacers is arranged on an element glass. FIG. 5B is a cross-sectional view schematically showing a state that the glass substrate 1 is attached to the sealing glass 2 after the state shown in FIG. 5A.

The present Preferred Embodiment is preferably the same as Preferred Embodiment 1, except that the element glass 1 is attached to the sealing glass 2 as shown in FIG. 5B, after the liquid sealing member 5 including spherical spacers 7 is arranged on the element glass 1 as shown in FIG. 5A. The average particle size of the spacer 7 is preferably about 1 µm to about 100 µm, and it is more preferably about 20 µm or less, for example, in view of sealing performances and light transmittance. Thus, the spacers 7 are included in the liquid sealing member 5, and thereby, a gap between the element glass 1 and the sealing glass 2 can be kept constant. In this case, the solid sealing member that is arranged on the organic EL element 3 does not need to include spacers, and so, the organic EL element 3 is not likely to be damaged directly by external pressure and the like. Further, in this case, a photospacer for gap control, and the like, does not need to be arranged on the element glass 1 or the sealing glass 2, and so the production processes are greatly simplified.

It is preferable that the liquid sealing member 5 in which the spacers 7 have been included is subjected to stirring and vacuum degassing in order to remove volatile contents therefrom. The material for the spacer 7 is not especially limited, and plastic, silica, and the like, are mentioned. The shape of the spacer 7 is not especially limited, and a spherical shape, a cylindrical shape, and the like, are mentioned.

The present application claims priority to Patent Application No. 2006-350163 filed in Japan on Dec. 26, 2006 and Patent Application No. 2007-252179 filed in Japan on Sep. 27, 2007 under the Paris Convention and provisions of national law in a designated State, the entire contents of which are hereby incorporated by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An organic electroluminescent panel comprising:
   an element substrate;
   a sealing substrate facing the element substrate;
   an organic electroluminescent element located on a sealing substrate side of the element substrate;
   a first sealing member arranged to seal a gap between the element substrate and the sealing substrate;
   a second sealing member arranged to cover the organic electroluminescent element; wherein
   the first sealing member and the second sealing member are arranged with a space therebetween, the first sealing member including a photocurable resin and the second sealing member including a thermocurable resin; and
   the space is in a vacuum or reduced pressure state.

2. The organic electroluminescent panel according to claim 1, wherein the first sealing member includes a spacer.

3. The organic electroluminescent panel according to claim 1, wherein a plurality of the organic electroluminescent elements are collectively covered with the second sealing member.

4. The organic electroluminescent panel according to claim 1, wherein the second sealing member has a thickness of about 1 µm to about 100 µm.

5. The organic electroluminescent panel according to claim 1, wherein the second sealing member has a light transmittance of about 80% or more in a visible wavelength range.

6. The organic electroluminescent panel according to claim 1, wherein a difference in linear expansion coefficient between the first sealing member and the second sealing member is about $1.0 \times 10^{-4} (K^{-1})$ or less.

7. The organic electroluminescent panel according to claim 6, wherein a difference in linear expansion coefficient among the first sealing member, the second sealing member, the element substrate, and the sealing substrate is about $1.0 \times 10^{-4} (K^{-1})$ or less.

8. The organic electroluminescent panel according to claim 1, wherein the organic electroluminescent panel has a top-emission structure.

9. An organic electroluminescent display comprising the organic electroluminescent panel according to claim 1.

10. An organic electroluminescent lighting device comprising the organic electroluminescent panel according to claim 1.

11. A method for producing an organic electroluminescent panel by attaching an element substrate including an organic electroluminescent element to a sealing substrate, comprising:
    a solid sealing member-arranging step of arranging a solid sealing member on the organic electroluminescent element;
    a liquid adhesive-arranging step of arranging a liquid adhesive around the solid sealing member;
    an attachment step of attaching the sealing substrate to the element substrate with the solid sealing member and the liquid adhesive in a vacuum or reduced pressure environment;
    a liquid adhesive-curing step of curing the liquid adhesive in an inert gas atmosphere; and
    a solid sealing member-curing step of curing the solid sealing member after the liquid adhesive-curing step.

12. The production method of the organic electroluminescent panel according to claim 11, wherein in the solid sealing member-arranging step, a plurality of the organic electroluminescent elements are collectively covered with the solid sealing member.

13. The production method of the organic electroluminescent panel according to claim 11, wherein in the liquid adhesive-arranging step, the liquid adhesive and the solid sealing member are arranged with a space therebetween as viewed in plan.

14. The production method of the organic electroluminescent panel according to claim 11, wherein the liquid adhesive includes a photocurable resin, and in the liquid adhesive-curing step, the liquid adhesive is cured by photoirradiation.

15. The production method of the organic electroluminescent panel according to claim 11, wherein the liquid adhesive includes a spacer.

16. The production method of the organic electroluminescent panel according to claim 11, wherein in the solid sealing member-curing step, the solid sealing member is softened and then cured.

17. The production method of the organic electroluminescent panel according to claim 16, wherein the solid sealing member has thermoplasticity.

18. The production method of the organic electroluminescent panel according to claim 11, wherein in the solid sealing member-curing step, the solid sealing member is cured by polymerization.

19. The production method of the organic electroluminescent panel according to claim 18, wherein in the solid sealing member-curing step, the solid sealing member is cured by photopolymerization or thermopolymerization.

20. The production method of the organic electrouminescent panel according to claim 11, wherein a cured product of the solid sealing member has a light transmittance of about 80% or more in a visible wavelength range.

21. A production method of an organic electroluminescent display, comprising the production method of the organic electroluminescent panel according to claim 11.

22. A production method of an organic electroluminescent lighting device, comprising the production method of the organic electroluminescent panel according to claim 11.

23. The electroluminescent panel according to claim 1, wherein the second sealing member attaches the element substrate to the sealing substrate.

\* \* \* \* \*